United States Patent
Lee et al.

(10) Patent No.: US 9,786,697 B2
(45) Date of Patent: Oct. 10, 2017

(54) THIN FILM TRANSISTOR SUBSTRATE AND DISPLAY DEVICE USING THE SAME

(71) Applicant: LG DISPLAY CO., LTD., Seoul (KR)

(72) Inventors: Sohyung Lee, Goyang-si (KR); Youngyoung Chang, Goyang-si (KR); Kwonshik Park, Seoul (KR); Mincheol Kim, Paju-si (KR); Jeongsuk Yang, Asan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/182,265

(22) Filed: Jun. 14, 2016

(65) Prior Publication Data
US 2016/0372497 A1 Dec. 22, 2016

(30) Foreign Application Priority Data
Jun. 19, 2015 (KR) .......................... 10-2015-0087209

(51) Int. Cl.
| H01L 27/12 | (2006.01) |
| H01L 27/32 | (2006.01) |
| G02F 1/13 | (2006.01) |
| G02F 1/1362 | (2006.01) |
| G02F 1/1368 | (2006.01) |
| G02F 1/1343 | (2006.01) |

(52) U.S. Cl.
CPC .... *H01L 27/1255* (2013.01); *G02F 1/136213* (2013.01); *H01L 27/124* (2013.01); *H01L 27/1222* (2013.01); *H01L 27/1225* (2013.01); *H01L 27/1251* (2013.01); *G02F 1/1368* (2013.01); *G02F 2001/134372* (2013.01); *H01L 27/3265* (2013.01)

(58) Field of Classification Search
CPC ............. H01L 27/1255; H01L 27/1222; H01L 27/124; H01L 27/3211; H01L 27/3246; H01L 27/3248; G02F 1/133345; G02F 1/134309; G02F 1/136213; G02F 1/136227; G02F 1/1368
See application file for complete search history.

(56) References Cited

U.S. PATENT DOCUMENTS 6,522,066 B2 * 2/2003 Sheu ..................... H01L 27/322
  313/498
6,741,313 B2 * 5/2004 Kim .................. G02F 1/134363
  349/139

(Continued)

*Primary Examiner* — Ida M Soward
(74) *Attorney, Agent, or Firm* — Dentons US LLP

(57) ABSTRACT

A thin film transistor (TFT) substrate and a display device using the same are disclosed. The TFT substrate includes a first TFT including a polycrystalline semiconductor layer, a first gate electrode, a first source electrode, and a first drain electrode deposited on a substrate, a second TFT separated from the first TFT, the second TFT including a second gate electrode, an oxide semiconductor layer, a second source electrode, and a second drain electrode deposited on the first gate electrode, and a plurality of storage capacitors separated from the first and second TFTs, each storage capacitor including a first dummy semiconductor layer, a first gate insulating layer on the first dummy semiconductor layer, a first dummy gate electrode on the first gate insulating layer, and an intermediate insulating layer on the first dummy gate electrode.

10 Claims, 13 Drawing Sheets

(56) References Cited

U.S. PATENT DOCUMENTS

| | | | | |
|---|---|---|---|---|
| 8,379,175 B2* | 2/2013 | Ishii | ............... | G02F 1/136213 |
| | | | | 349/139 |
| 8,994,010 B2* | 3/2015 | Choi | ............... | H01L 51/5008 |
| | | | | 257/40 |
| 9,165,993 B2* | 10/2015 | Kim | ............... | H01L 27/3265 |
| 9,305,941 B2* | 4/2016 | Chang | ............... | H01L 27/1237 |
| 2004/0218129 A1* | 11/2004 | Mochizuki | ............ | G02F 1/1337 |
| | | | | 349/139 |
| 2006/0243977 A1* | 11/2006 | Yamasaki | ............. | H01L 27/124 |
| | | | | 257/59 |
| 2009/0085037 A1* | 4/2009 | Chen | ............... | H01L 27/124 |
| | | | | 257/71 |
| 2015/0084022 A1* | 3/2015 | Koshihara | ........... | H01L 27/3246 |
| | | | | 257/40 |
| 2016/0027412 A1* | 1/2016 | Igawa | ............... | G09G 3/3648 |
| | | | | 345/213 |

* cited by examiner

THIN FILM TRANSISTOR SUBSTRATE AND DISPLAY DEVICE USING THE SAME

This application claims the benefit of Korean Patent Application No. 10-2015-0087209 filed on Jun. 19, 2015, which is incorporated herein by reference for all purposes as if fully set forth herein.

BACKGROUND OF THE INVENTION

Field of the Invention

The present disclosure relates to a display device and a method of manufacturing the same. More particularly, the present disclosure relates to a display device including a thin film transistor (TFT) substrate.

Discussion of the Related Art

As information society is developed, display devices for representing information are in demand. A field of display devices has rapidly changed from large-sized cathode ray tubes (CRTs) to flat panel displays (FPDs) which have advantageous characteristics of thin profile and lightweight and can be implemented into a large-sized screen. Examples of flat panel displays include liquid crystal displays (LCDs), plasma display panels (PDPs), organic light emitting diode (OLED) displays, and electrophoresis displays (EPDs).

A display panel of an LCD, an OLED display, and an EPD driven in an active manner may include a thin film transistor (TFT) substrate having a plurality of thin film transistors allocated in the pixel area arranged in a matrix. For example, an LCD device displays an image by controlling the light transmittance of a liquid crystal layer using an electric field. An OLED display represents video data by generating properly controlled light at each pixel arranged in a matrix using an OLED formed in each pixel.

OLED displays, which are a self-emitting display device, have many advantages, such as fast response time, high emission efficiency, high luminance, and wide viewing angle. OLED displays using an organic light emitting diode having good energy efficiency may be classified into a passive matrix OLED display and an active matrix OLED display.

As the development of personal electronic devices has been actively carried out, portable and/or wearable display devices have been actively developed. In order to apply a display device to a portable and/or wearable device, it is beneficial for the display device to have low power consumption. However, conventional display devices may have a limitation on low power consumption while maintaining or increasing the amount of capacitance of a storage capacitor.

SUMMARY OF THE INVENTION

Accordingly, the present invention is directed to a display device and a method of manufacturing the same that substantially obviate one or more problems due to limitations and disadvantages of the related art.

An advantage of the present invention is to provide a display device with improved image quality.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate may, for example, include a first thin film transistor on a substrate and including a polycrystalline semiconductor layer, a first gate electrode, a first source electrode and a first drain electrode; a second thin film transistor separated from the first thin film transistor and including a second gate electrode, an oxide semiconductor layer, a second source electrode, and a second drain electrode that are disposed on a layer covering the first gate electrode; and a plurality of storage capacitors separated from the first and second thin film transistors, the plurality of storage capacitors each including a first dummy semiconductor layer, a first gate insulating layer on the first dummy semiconductor layer, a first dummy gate electrode on the first gate insulating layer, an intermediate insulating layer on the first dummy gate electrode, a second dummy gate electrode on the intermediate insulating layer, a second gate insulating layer on the second dummy gate electrode, a first dummy source-drain electrode on the second gate insulating layer, a passivation layer on the first dummy source-drain electrode, and a dummy pixel electrode on the passivation layer.

In another aspect, a thin film transistor substrate may, for example, include a first thin film transistor on a substrate and including a polycrystalline semiconductor layer, a first gate electrode, a first source electrode, and a first drain electrode; a second thin film transistor separated from the first thin film transistor, the second thin film transistor including a second gate electrode, an oxide semiconductor layer, a second source electrode, and a second drain electrode that are disposed on the polycrystalline semiconductor layer of the first thin film transistor; and a plurality of storage capacitors separated from the first and second thin film transistors, the plurality of storage capacitors each including a first dummy semiconductor layer, a first gate insulating layer on the first dummy semiconductor layer, a first dummy gate electrode on the first gate insulating layer, an intermediate insulating layer on the first dummy gate electrode, a second gate insulating layer on the intermediate insulating layer, a first dummy source-drain electrode on the second gate insulating layer, a passivation layer on the first dummy source-drain electrode, and a dummy pixel electrode on the passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
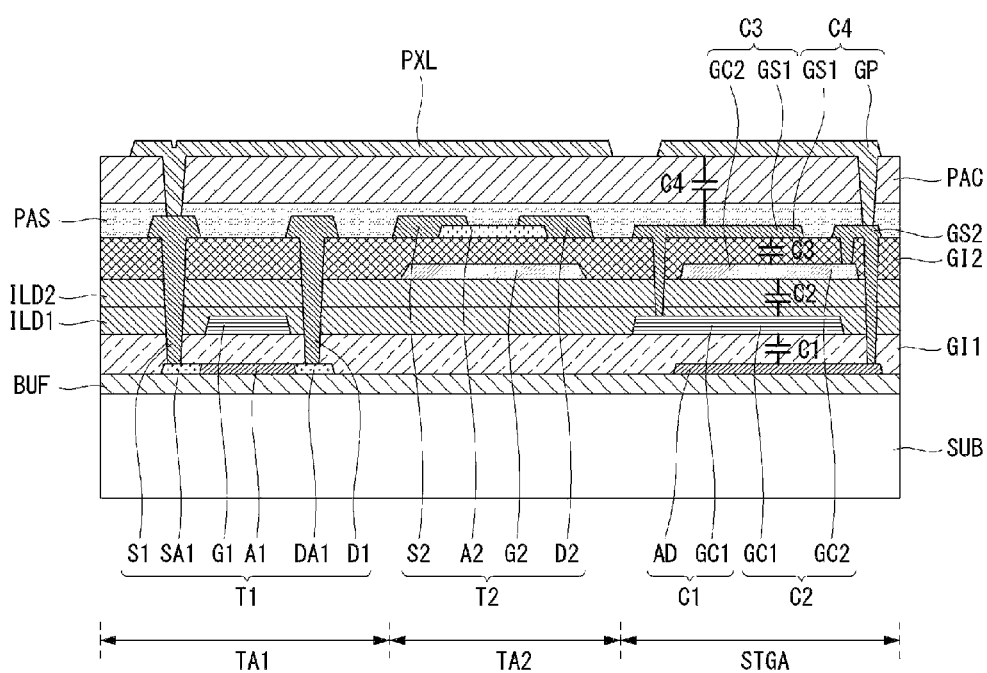
FIG. 1 is a cross-sectional view illustrating a thin film transistor (TFT) substrate for display device including different types of TFTs according to a first embodiment of the present disclosure.

Reference will now be made in detail to embodiments of the invention, examples of which are illustrated in the accompanying drawings. Wherever possible, the same reference numbers will be used throughout the drawings to refer to the same or like parts. A detailed description of known arts will be omitted if it is determined that the arts can mislead the embodiments of the invention.

A thin film transistor (TFT) substrate for a flat panel display according to an embodiment of the present disclosure includes a first thin film transistor disposed in a first area and a second thin film transistor disposed in a second area, on the same substrate. The substrate may include a display area and a non-display area. In the display area, a plurality of pixel areas are arranged in a matrix in which display elements are disposed. In the non-display area surrounding the display area, driving elements for driving the display elements of the pixel area are disposed.

As polycrystalline semiconductor material has characteristics of high mobility (e.g., over 100 cm²/Vs), low energy consumption power and high reliability, it can be applied to a driver IC, such as a gate driver, and/or a multiplexer (MUX) for driving TFTs of the display elements. In addition, it may be applied to a driving TFT disposed in the pixel area of an organic light emitting diode (OLED) display. On the other hand, as oxide semiconductor material has low off-current, it can be applied to a channel layer of a switching TFT in the pixel area that may be driven with a short ON-time period and a long OFF-time period. Further, as the off-current is low, the size of an auxiliary capacitance may decrease. Hence, it may be suitable for the display elements with a high resolution. An embodiment of the present disclosure can obtain a TFT substrate suitable for portable and/or wearable displays by disposing a TFT for the driving elements and another TFT for the display elements on the same substrate, with each TFT having a different characteristic.

When a semiconductor layer is formed of a polycrystalline semiconductor material, an impurity injecting process and a high temperature thermal process are typically performed. On the other hand, a semiconductor layer can be formed of an oxide semiconductor material under a relatively lower temperature process. Therefore, it is preferable that a polycrystalline semiconductor layer is first formed under a higher thermal condition, and then an oxide semiconductor layer is formed. According to an embodiment of the present disclosure, a first TFT including a polycrystalline semiconductor material may have a top-gate coplanar structure, and a second TFT including an oxide semiconductor material may have a bottom-gate back channel etch (BCE) structure.

From a point of view of manufacturing process, when a polycrystalline semiconductor material has vacancies, its characteristics may be degraded. Therefore, a hydrogenation process may be performed to fill the vacancies with hydrogen atoms. On the other hand, for an oxide semiconductor material, vacancies may act as carriers and be desired. Therefore, a thermal process may be performed to maintain the vacancies in the oxide semiconductor material. The two processes, the hydrogenation process and the thermal process, may be performed through subsequent thermal processes at a temperature of 350 to 380° C.

For the hydrogenation process, a nitride layer including many hydrogen atoms may be provided on the polycrystalline semiconductor material. Hydrogen atoms may be diffused into the polycrystalline semiconductor material through a thermal process. As a result, the polycrystalline semiconductor layer may be stabilized. During the hydrogenation process, it is beneficial for hydrogen atoms to not be diffused into the oxide semiconductor material. To do so, an oxide layer may be disposed between the nitride layer and the oxide semiconductor material. Thus, even after the thermal process, the oxide semiconductor layer can be stabilized because the oxide semiconductor material is scarcely affected by hydrogen atoms.

In embodiments disclosed herein, the first area may be the non-display area, and the second area may be a portion or an entire portion of the display area. In this instance, the first TFT and the second TFT may be far apart from each other. Otherwise, the first area and the second area may be included in the display area. Especially, when a plurality of TFTs are disposed in a single pixel area, the first TFT and the second TFT may be adjacently disposed.

In the following description, the first TFT for the driving elements is disposed in the first area and the second TFT for the switching elements is disposed in the second area for the sake of brevity and ease of understanding. However, embodiments of the present disclosure are not limited thereto. Also, in the following description, one TFT is formed in each of the first area and the second area as an example for the sake of brevity and ease of understanding, but embodiments of the present disclosure are not limited thereto. For example, more than one TFT can be formed in each of the first area and the second area. Further, in the following description, a mask process refers to a photolithography process that includes a plurality of processes including a photomask alignment process, an exposure process, a development process, an etching process, etc.

First Embodiment

Figure 2:
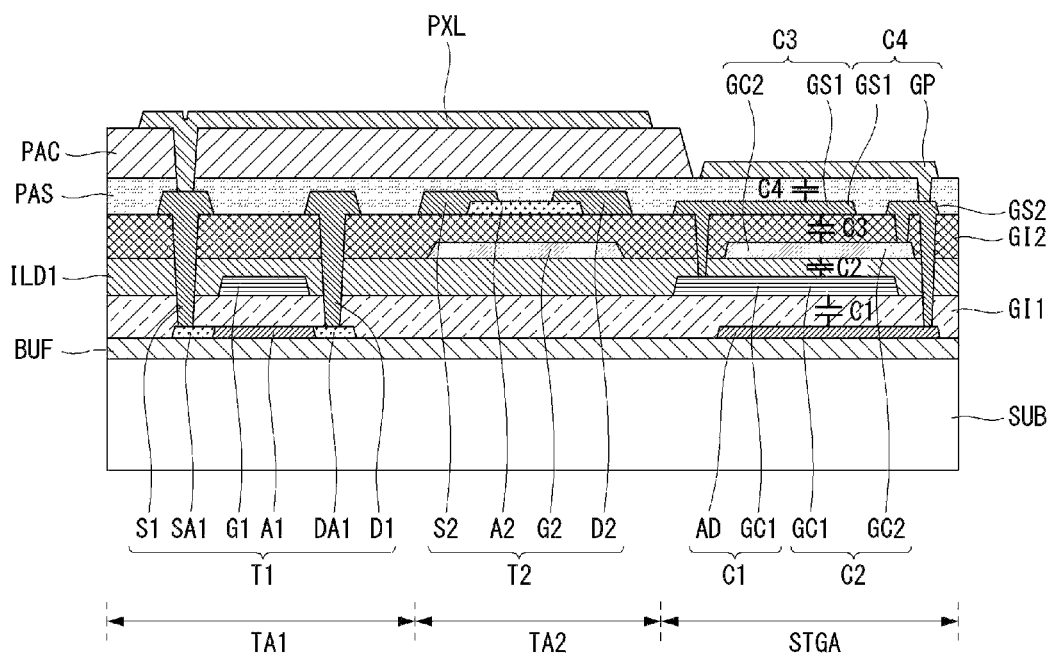
FIG. 2 is a cross-sectional view illustrating a modified example of a TFT substrate according to a first embodiment of the present disclosure.

FIG. 1 is a cross-sectional view illustrating a thin film transistor (TFT) substrate for a display device including different types of TFTs according to the first embodiment of the present disclosure. FIG. 2 is a cross-sectional view illustrating a modified example of FIG. 1. In the embodiment disclosed herein, a cross-sectional view of a portion of the TFT substrate is illustrated for the sake of brevity and ease of understanding.

Referring to FIG. 1, the TFT substrate for a display device according to the first embodiment of the present disclosure includes a first TFT T1 and a second TFT T2 that are disposed on a substrate SUB, and first to fourth storage capacitors C1 to C4. The first TFT T1 and the second TFT T2 may be separated from each other at a predetermined distance.

A buffer layer BUF is formed on an entire surface of the substrate SUB. The buffer layer BUF may have a single-layered structure including silicon nitride (SiNx) or silicon oxide (SiOx) or a multi-layered structure including silicon nitride (SiNx) and silicon oxide (SiOx). The buffer layer BUF can improve an adhesive strength between a subsequently formed layer and the substrate SUB and block an alkali component from the substrate SUB.

A light shielding layer may be formed between the substrate SUB and the buffer layer BUF to block light incident from the outside. The light shielding layer may be formed of a metal material that can block light. In particular, the light shielding layer may be formed in an island shape corresponding to channel regions of the first and second TFTs T1 and T2.

First semiconductor layers A1, SA1, and DA1 and a first dummy semiconductor layer AD are formed on the buffer layer BUF. The first semiconductor layers A1, SA1, and DA1 are formed in a first area TA1, and the first dummy semiconductor layer AD is formed in a storage capacitor area STGA separated from the first semiconductor layers A1, SA1, and DA1. The first semiconductor layers A1, SA1, and DA1 include a channel region A1, a source region SA1, and a drain region DA1 of the first TFT T1. The channel region A1, the source region SA1, and the drain region DA1 are defined by the doping of ions.

A first semiconductor material is formed on the buffer layer BUF and is patterned to separately form the first semiconductor layers A1, SA1, and DA1 and the first dummy semiconductor layer AD. The first dummy semiconductor layer AD becomes a first electrode (or a lower electrode) of the first storage capacitor C1.

It is preferable, but not required, that the first TFT T1 includes a polycrystalline semiconductor material, for example, polycrystalline silicon. Further, it is preferable, but not required, that the first TFT T1 has a top-gate structure. The first semiconductor layers A1, SA1, and DA1 are polycrystalline silicon layers by depositing an amorphous silicon material and performing a dehydrogenation process and a crystallization process.

A first gate insulating layer GI1 is formed on the first semiconductor layers A1, SA1, and DA1, the first dummy semiconductor layer AD, and the buffer layer BUF. The first gate insulating layer GI1 is selected as a silicon nitride (SiNx) layer or a silicon oxide (SiOx) layer. The first gate insulating layer GI1 insulates the first semiconductor layers A1, SA1, and DA1 from the first dummy semiconductor layer AD.

A first gate electrode G1 and a first dummy gate electrode GC1 are formed on the first gate insulating layer GI1. The first gate electrode G1 is formed in the first area TA1, and the first dummy gate electrode GC1 is formed in the storage capacitor area STGA. A metal material is formed on the first gate insulating layer GI1 and is patterned to form the first gate electrode G1 and the first dummy gate electrode GC1. The first gate electrode G1 is disposed to overlap the channel region A1 among the first semiconductor layers A1, SA1, and DA1, and the first dummy gate electrode GC1 is separated from the first gate electrode G1.

The first dummy gate electrode GC1 becomes a second electrode (or an upper electrode) of the first storage capacitor C1 and also becomes a first electrode (or a lower electrode) of the second storage capacitor C2. The first dummy semiconductor layer AD and the first dummy gate electrode GC1 constitute the first storage capacitor C1.

First and second intermediate insulating layers ILD1 and ILD2 are deposited on the first gate insulating layer GI1 on which the first gate electrode G1 and the first dummy gate electrode GC1 are formed. The first and second intermediate insulating layers ILD1 and ILD2 are selected as a silicon nitride (SiNx) layer and a silicon oxide (SiOx) layer. The silicon nitride layer is deposited to diffuse hydrogen atoms contained in the silicon nitride layer through a subsequent process and perform a hydrogenation process on the first semiconductor layers A1, SA1, and DA1 including polycrystalline silicon. The hydrogenation process is a process for filling vacancies, which are not bonded after an activation, with hydrogen atoms and is typically performed at a low temperature unlike the activation. Further, because the hydrogenation process is more affected by time than temperature, the hydrogenation process can obtain an enhanced result by increasing a process time of the hydrogenation process. The silicon oxide layer is deposited to reduce or prevent deformation (or degradation) of an oxide semiconductor element resulting from the hydrogen atoms contained in the silicon nitride layer.

A second gate electrode G2 and a second dummy gate electrode GC2 are formed on the first and second intermediate insulating layers ILD1 and ILD2. The second gate electrode G2 is formed in a second area TA2, and the second dummy gate electrode GC2 is formed in the storage capacitor area STGA.

A metal material is formed on the first and second intermediate insulating layers ILD1 and ILD2 and is patterned to form the second gate electrode G2 and the second dummy gate electrode GC2. The second gate electrode G2 is disposed to overlap a channel region A2 of a second semiconductor layer A2 to be formed in a subsequent process, and the second dummy gate electrode GC2 is separated from the second gate electrode G2.

The second dummy gate electrode GC2 becomes a second electrode (or an upper electrode) of the second storage capacitor C2 and also becomes a first electrode (or a lower electrode) of the third storage capacitor C3. The first dummy gate electrode GC1 and the second dummy gate electrode GC2 constitute the second storage capacitor C2.

A second gate insulating layer GI2 is formed on the second intermediate insulating layer ILD2, on which the second gate electrode G2 and the second dummy gate electrode GC2 are formed. The second gate insulating layer GI2 is selected as a silicon oxide (SiOx) layer. The second gate insulating layer GI2 insulates the second gate electrode G2 from the second dummy gate electrode GC2.

The second semiconductor layer A2 is formed on the second gate insulating layer GI2. The second semiconductor layer A2 is formed in the second area TA2. An oxide semiconductor material, for example, indium gallium zinc oxide (IGZO) is formed on the second gate insulating layer GI2 and is patterned to form the second semiconductor layer A2, and a thermal process is performed on the second semiconductor layer A2. The second semiconductor layer A2 is disposed to overlap the second gate electrode G2.

First source and drain electrodes S1 and D1, second source and drain electrodes S2 and D2, a first dummy source-drain electrode GS1, and a second dummy source-drain electrode GS2 are formed on the second gate insulating layer GI2. A source material and a drain material are formed on the second gate insulating layer GI2 and are patterned to separately form the first source and drain electrodes S1 and D1 in the first area TA1, the second source and drain electrodes S2 and D2 in the second area TA2, and the first dummy source-drain electrode GS1 and the second dummy source-drain electrode GS2 in the storage capacitor area STGA.

The first source electrode S1 is connected to the source region SA1 of the first semiconductor layers A1, SA1, and DA1 through a contact hole, and the first drain electrode D1 is connected to the drain region DA1 of the first semiconductor layers A1, SA1, and DA1 through a contact hole. The first source and drain electrodes S1 and D1 become source and drain electrodes of the first TFT T1.

The second source and drain electrodes S2 and D2 are separated from the first source and drain electrodes S1 and D1. The second source electrode S2 is connected to a source region of the second semiconductor layer A2, and the second drain electrode D2 is connected to a drain region of the second semiconductor layer A2. The second source and drain electrodes S2 and D2 become source and drain electrodes of the second TFT T2. The second source and drain electrodes S2 and D2 are formed on the same stratum as the first source and drain electrodes S1 and D1 using the same material as the first source and drain electrodes S1 and D1.

The first dummy source-drain electrode GS1 is connected to the first dummy gate electrode GC1 through a contact hole. The first dummy source-drain electrode GS1 is disposed to overlap the first dummy gate electrode GC1. The first dummy source-drain electrode GS1 becomes a second electrode (or an upper electrode) of the third storage capacitor C3 and also becomes a first electrode (or a lower electrode) of the fourth storage capacitor C4. The second dummy gate electrode GC2 and the first dummy source-drain electrode GS1 constitute the third storage capacitor C3.

The second dummy source-drain electrode GS2 is commonly connected to the first dummy semiconductor layer AD and the second dummy gate electrode GC2 through a contact hole. The second dummy source-drain electrode GS2 is separated from the first dummy source-drain electrode GS1 and is disposed to overlap the first dummy semiconductor layer AD and the second dummy gate electrode GC2.

A passivation layer PAS is formed on the second gate insulating layer GI2, on which the first source and drain electrodes S1 and D1, the second source and drain electrodes S2 and D2, the first dummy source-drain electrode GS1, and the second dummy source-drain electrode GS2 are formed.

A planarization layer PAC is formed on the passivation layer PAS. The planarization layer PAC may be formed of an organic material with a high thickness and a low permittivity, thereby uniformly planarizing the surface. Other methods can be used.

A pixel electrode PXL and a dummy pixel electrode GP are formed on the planarization layer PAC. A transparent electrode material, for example, indium tin oxide (ITO) is formed on the passivation layer PAS and is patterned to separately form the pixel electrode PXL in the first and second areas TA1 and TA2 and the dummy pixel electrode GP in the storage capacitor area STGA.

The pixel electrode PXL is connected to the first source electrode S1 through a contact hole. The pixel electrode PXL becomes a pixel electrode of a liquid crystal display, or becomes an anode electrode (or a cathode electrode) of an OLED display depending on a structure of a display panel which will be formed later.

The dummy pixel electrode GP is connected to the second dummy source-drain electrode GS2 through a contact hole. The dummy pixel electrode GP is disposed to overlap the first and second dummy source-drain electrodes GS1 and GS2. The dummy pixel electrode GP becomes a second electrode (or an upper electrode) of the fourth storage capacitor C4. The first dummy source-drain electrode GS1 and the dummy pixel electrode GP constitutes the fourth storage capacitor C4.

Referring to FIG. 2, a TFT substrate for a display device according to a modified example of the first embodiment of the present disclosure includes a first TFT T1 and a second TFT T2, that are disposed on a substrate SUB, and first to fourth storage capacitors C1 to C4. The first TFT T1 and the second TFT T2 may be separated from each other at a predetermined distance.

According to the modified example of the first embodiment of the present disclosure, a planarization layer PAC positioned in a storage capacitor area STGA is patterned and removed. Hence, a dummy pixel electrode GP is formed through the same process as a pixel electrode PXL and is positioned on a passivation layer PAS. When the dummy pixel electrode GP is positioned on the passivation layer PAS as described above, charge characteristics of the fourth storage capacitor C4 can be further improved, as $C = E*A/d$, wherein C is a capacitance, E is permittivity, A is an area, and d is a distance.

According to the modified example of the first embodiment of the present disclosure, only a first intermediate insulating layer ILD1 is formed on a first gate insulating layer GI1. When only the first intermediate insulating layer ILD1 is formed on the first gate insulating layer GI1 as described above, the first intermediate insulating layer ILD1 is selected as a silicon nitride (SiNx) layer, and a second gate insulating layer GI2 formed on the first intermediate insulating layer ILD1 is selected as a silicon oxide (SiOx) layer.

According to the modified example of the first embodiment of the present disclosure, because the intermediate insulating layer is configured with a single layer, not multiple layers, a turn-on current Ion of the TFT can be reduced or prevented from decreasing due to an increase in a thickness of the intermediate insulating layer. Further, a size of the TFT can be decreased, while uniformly securing a turn-on current Ion.

Afterwards, the TFT substrate for a display device is implemented in a flat panel display, such as a liquid crystal display and an OLED display, depending on electrodes and structures formed after the pixel electrode.

As described above, the TFT substrate for a display device according to the first embodiment of the present disclosure has a structure, in which the first TFT T1 including the polycrystalline semiconductor material and the second TFT T2 including the oxide semiconductor material are formed on the same substrate SUB. In particular, the source and drain electrodes of the first TFT T1 and the source and drain electrodes of the second TFT T2 are formed on the same stratum using the same material. Further, the TFT substrate includes the plurality of storage capacitors C1 to C4 formed based on the semiconductor layer and the electrodes constituting the first and second TFTs T1 and T2.

Second Embodiment

Figure 3:
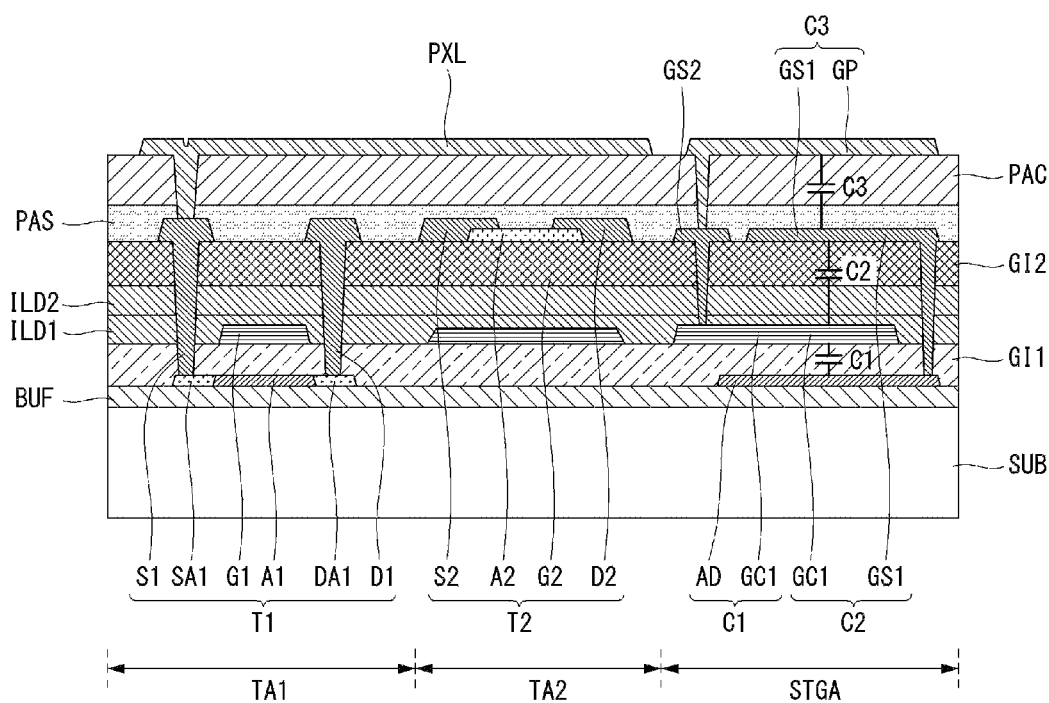
FIG. 3 is a cross-sectional view illustrating a TFT substrate for display device including different types of TFTs according to a second embodiment of the present disclosure.
Figure 4:
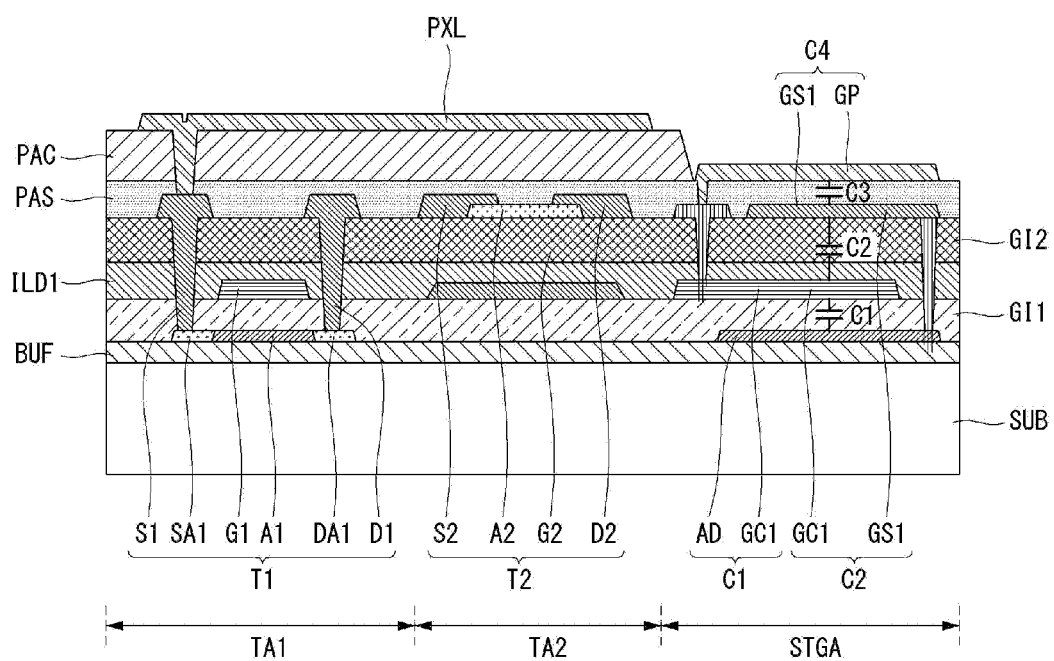
FIG. 4 is a cross-sectional view illustrating a modified example of a TFT substrate according to a second embodiment of the present disclosure.

FIG. 3 is a cross-sectional view illustrating a TFT substrate for a display device including different types of TFTs according to the second embodiment of the present disclosure. FIG. 4 is a cross-sectional view illustrating a modified example of FIG. 3. In the embodiment disclosed herein, a cross-sectional view of a portion of the TFT substrate is illustrated for the sake of brevity and ease of understanding.

Referring to FIG. 3, the TFT substrate for a display device according to the second embodiment of the present disclosure includes a first TFT T1 and a second TFT T2 that are disposed on a substrate SUB, and first to third storage capacitors C1 to C3. The first TFT T1 and the second TFT T2 may be separated from each other at a predetermined distance.

A buffer layer BUF is formed on an entire surface of the substrate SUB. The buffer layer BUF may have a single-layered structure including silicon nitride (SiNx) or silicon oxide (SiOx) or a multi-layered structure including silicon nitride (SiNx) and silicon oxide (SiOx). The buffer layer BUF can improve an adhesive strength between a subsequently formed layer and the substrate SUB and block an alkali component from the substrate SUB.

A light shielding layer may be formed between the substrate SUB and the buffer layer BUF to block light incident from the outside. The light shielding layer may be formed of a metal material that can block light. In particular, the light shielding layer may be formed in an island shape corresponding to channel regions of the first and second TFTs T1 and T2.

First semiconductor layers A1, SA1, and DA1 and a first dummy semiconductor layer AD are formed on the buffer layer BUF. The first semiconductor layers A1, SA1, and DA1 are formed in a first area TA1, and the first dummy semiconductor layer AD is formed in a storage capacitor area STGA separated from the first semiconductor layers A1, SA1, and DA1. The first semiconductor layers A1, SA1, and DA1 include a channel region A1, a source region SA1, and a drain region DA1 of the first TFT T1. The channel region A1, the source region SA1, and the drain region DA1 are defined by the doping of ions.

A first semiconductor material is formed on the buffer layer BUF and is patterned to separately form the first semiconductor layers A1, SA1, and DA1 and the first dummy semiconductor layer AD. The first dummy semiconductor layer AD becomes a first electrode (or a lower electrode) of the first storage capacitor C1.

It is preferable, but not required, that the first TFT T1 includes a polycrystalline semiconductor material, for example, polycrystalline silicon. Further, it is preferable, but not required, that the first TFT T1 has a top-gate structure. The first semiconductor layers A1, SA1, and DA1 are polycrystalline silicon layers by depositing an amorphous silicon material and performing a dehydrogenation process and a crystallization process.

A first gate insulating layer GI1 is formed on the first semiconductor layers A1, SA1, and DA1, the first dummy semiconductor layer AD, and the buffer layer BUF. The first gate insulating layer GI1 is selected as a silicon nitride (SiNx) layer or a silicon oxide (SiOx) layer. The first gate insulating layer GI1 insulates the first semiconductor layers A1, SA1, and DA1 from the first dummy semiconductor layer AD.

A first gate electrode G1, a second gate electrode G2, and a first dummy gate electrode GC1 are formed on the first gate insulating layer GI1. The first gate electrode G1 is formed in the first area TA1, the second gate electrode G2 is formed in a second area TA2, and the first dummy gate electrode GC1 is formed in the storage capacitor area STGA. A metal material is formed on the first gate insulating layer GI1 and is patterned to form the first gate electrode G1, the second gate electrode G2, and the first dummy gate electrode GC1. The first gate electrode G1, the second gate electrode G2, and the first dummy gate electrode GC1 are formed on the same stratum using the same material.

The first dummy gate electrode GC1 becomes a second electrode (or an upper electrode) of the first storage capacitor C1 and also becomes a first electrode (or a lower electrode) of the second storage capacitor C2. The first dummy semiconductor layer AD and the first dummy gate electrode GC1 constitute the first storage capacitor C1.

A first intermediate insulating layer ILD1 is deposited on the first gate insulating layer GI1 on which the first gate electrode G1, the second gate electrode G2, and the first dummy gate electrode GC1 are formed. The first intermediate insulating layer ILD1 is selected as a silicon nitride (SiNx) layer. The silicon nitride layer is deposited to diffuse hydrogen atoms contained in the silicon nitride layer through a subsequent process and perform a hydrogenation process on the first semiconductor layers A1, SA1, and DA1 including polycrystalline silicon. The hydrogenation process is a process for filling vacancies, which are not bonded after an activation, with hydrogen atoms and is typically performed at a low temperature unlike the activation. Further, because the hydrogenation process is more affected by time than temperature, the hydrogenation process can obtain an enhanced result by increasing a process time of the hydrogenation process.

A second gate insulating layer GI2 is formed on the first intermediate insulating layer ILD1. The second gate insulating layer GI2 is selected as a silicon oxide (SiOx) layer. The silicon oxide layer is deposited to reduce or prevent deformation (or degradation) of an oxide semiconductor element resulting from the hydrogen atoms contained in the silicon nitride layer. The second gate insulating layer GI2 is to address a problem resulting from the hydrogen atoms contained in a second semiconductor layer A2 to be formed in a subsequent process.

The second semiconductor layer A2 is formed on the second gate insulating layer GI2. The second semiconductor layer A2 is formed in the second area TA2. An oxide semiconductor material, for example, indium gallium zinc oxide (IGZO) is formed on the second gate insulating layer GI2 and is patterned to form the second semiconductor layer A2, and a thermal process is performed on the second semiconductor layer A2. The second semiconductor layer A2 is disposed to overlap the second gate electrode G2.

First source and drain electrodes S1 and D1, second source and drain electrodes S2 and D2, a first dummy source-drain electrode GS1, and a second dummy source-drain electrode GS2 are formed on the second gate insulating layer GI2. A source material and a drain material are formed on the second gate insulating layer GI2 and are patterned to separately form the first source and drain electrodes S1 and D1 in the first area TA1, the second source and drain electrodes S2 and D2 in the second area TA2, and the first dummy source-drain electrode GS1 and the second dummy source-drain electrode GS2 in the storage capacitor area STGA.

The first source electrode S1 is connected to the source region SA1 of the first semiconductor layers A1, SA1, and DA1 through a contact hole, and the first drain electrode D1 is connected to the drain region DA1 of the first semiconductor layers A1, SA1, and DA1 through a contact hole. The first source and drain electrodes S1 and D1 become source and drain electrodes of the first TFT T1.

The second source and drain electrodes S2 and D2 are separated from the first source and drain electrodes S1 and D1. The second source electrode S2 is connected to a source region of the second semiconductor layer A2, and the second drain electrode D2 is connected to a drain region of the second semiconductor layer A2. The second source and drain electrodes S2 and D2 become source and drain electrodes of the second TFT T2. The second source and drain electrodes S2 and D2 are formed on the same stratum as the first source and drain electrodes S1 and D1 using the same material as the first source and drain electrodes S1 and D1.

The first dummy source-drain electrode GS1 is connected to the first dummy semiconductor layer AD through a contact hole. The first dummy source-drain electrode GS1 is disposed to overlap the first dummy semiconductor layer AD. The first dummy source-drain electrode GS1 becomes a second electrode (or an upper electrode) of the second storage capacitor C2 and also becomes a first electrode (or a lower electrode) of the third storage capacitor C3. The first dummy gate electrode GC1 and the first dummy source-drain electrode GS1 constitute the second storage capacitor C2.

The second dummy source-drain electrode GS2 is connected to the first dummy gate electrode GC1. The second dummy source-drain electrode GS2 is separated from the first dummy source-drain electrode GS1 and is disposed to overlap to the first dummy gate electrode GC1. The second dummy source-drain electrode GS2 functions as a connection electrode for an electrical connection between the first dummy gate electrode GC1 and a dummy pixel electrode to be formed in a subsequent process.

A passivation layer PAS is formed on the second gate insulating layer GI2, on which the first source and drain electrodes S1 and D1, the second source and drain electrodes S2 and D2, the first dummy source-drain electrode GS1, and the second dummy source-drain electrode GS2 are formed.

A planarization layer PAC is formed on the passivation layer PAS. The planarization layer PAC may be formed of an organic material with a high thickness and a low permittivity, thereby uniformly planarizing the surface. Other methods may be used.

A pixel electrode PXL and a dummy pixel electrode GP are formed on the planarization layer PAC. A transparent electrode material, for example, indium tin oxide (ITO) is formed on the passivation layer PAS and is patterned to separately form the pixel electrode PXL in the first and second areas TA1 and TA2 and the dummy pixel electrode GP in the storage capacitor area STGA.

The pixel electrode PXL is connected to the first source electrode S1 through a contact hole. The pixel electrode PXL becomes a pixel electrode of a liquid crystal display, or becomes an anode electrode (or a cathode electrode) of an OLED display depending on a structure of a display panel which will be formed later.

The dummy pixel electrode GP is connected to the second dummy source-drain electrode GS2 through a contact hole. The dummy pixel electrode GP is disposed to overlap the first and second dummy source-drain electrodes GS1 and GS2. The dummy pixel electrode GP becomes a second electrode (or an upper electrode) of the third storage capacitor C3. The first dummy source-drain electrode GS1 and the dummy pixel electrode GP constitutes the third storage capacitor C3.

Referring to FIG. 4, a TFT substrate for a display device according to a modified example of the second embodiment of the present disclosure includes a first TFT T1 and a second TFT T2, that are disposed on a substrate SUB, and first to third storage capacitors C1 to C3. The first TFT T1 and the second TFT T2 may be separated from each other at a predetermined distance.

According to the modified example of the second embodiment of the present disclosure, a planarization layer PAC positioned in a storage capacitor area STGA is patterned and removed. Hence, a dummy pixel electrode GP is formed through the same process as a pixel electrode PXL and is positioned on a passivation layer PAS. When the dummy pixel electrode GP is positioned on the passivation layer PAS as described above, charge characteristics of the third storage capacitor C3 can be further improved, as $C=\in*A/d$, wherein C is a capacitance, E is permittivity, A is an area, and d is a distance.

According to the modified example of the second embodiment of the present disclosure, because the intermediate insulating layer is configured with a single layer, not multiple layers, a turn-on current Ion of the TFT can be reduced or prevented from decreasing due to an increase in a thickness of the intermediate insulating layer. Further, a size of the TFT can be decreased, while uniformly securing a turn-on current Ion.

Afterwards, the TFT substrate for a display device is implemented in a flat panel display, such as a liquid crystal display and an OLED display, depending on electrodes and structures formed after the pixel electrode.

As described above, the TFT substrate for a display device according to the second embodiment of the present disclosure has the structure, in which the first TFT T1 including the polycrystalline semiconductor material and the second TFT T2 including the oxide semiconductor material are formed on the same substrate SUB. In particular, the source and drain electrodes of the first TFT T1 and the source and drain electrodes of the second TFT T2 as well as the gate electrodes of the first and second TFTs T1 and T2 are formed on the same stratum using the same material. Further, the TFT substrate includes the plurality of storage capacitors C1 to C3 formed based on the semiconductor layer and the electrodes constituting the first and second TFTs T1 and T2.

Third Embodiment

Figure 5:
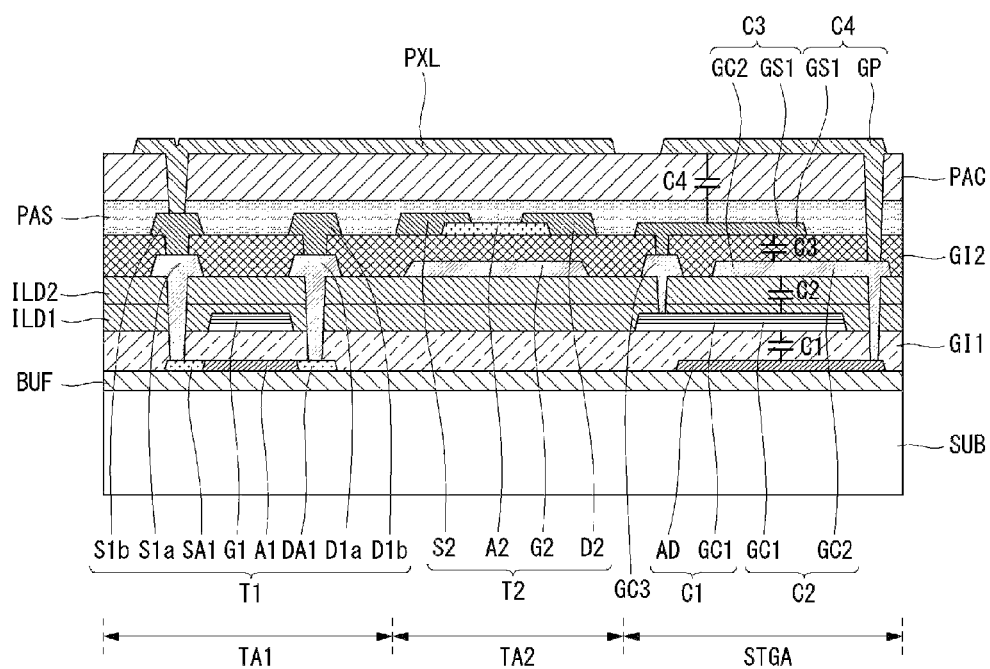
FIG. 5 is a cross-sectional view illustrating a TFT substrate for display device including different types of TFTs according to a third embodiment of the present disclosure.
Figure 6:
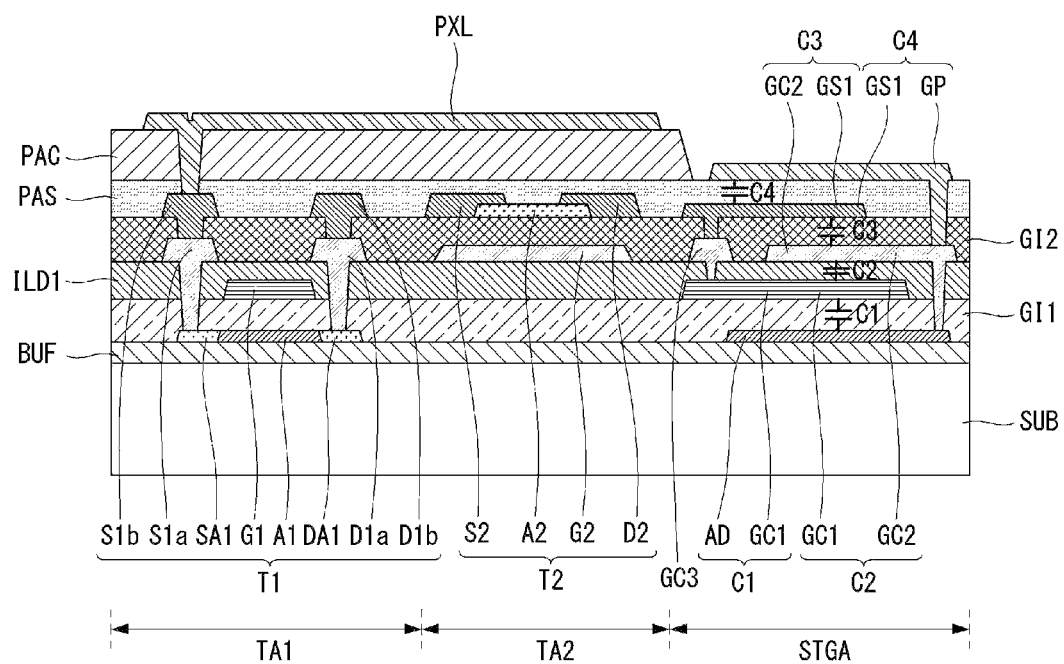
FIG. 6 is a cross-sectional view illustrating a modified example of a TFT substrate according to a third embodiment of the present disclosure.

FIG. 5 is a cross-sectional view illustrating a TFT substrate for a display device including different types of TFTs according to the third embodiment of the present disclosure. FIG. 6 is a cross-sectional view illustrating a modified example of FIG. 5. In the embodiment disclosed herein, a cross-sectional view of a portion of the TFT substrate is illustrated for the sake of brevity and ease of understanding.

Referring to FIG. 5, the TFT substrate for display device according to the third embodiment of the present disclosure includes a first TFT T1 and a second TFT T2 that are disposed on a substrate SUB, and first to fourth storage capacitors C1 to C4. The first TFT T1 and the second TFT T2 may be separated from each other at a predetermined distance.

A buffer layer BUF is formed on an entire surface of the substrate SUB. The buffer layer BUF may have a single-layered structure including silicon nitride (SiNx) or silicon oxide (SiOx) or a multi-layered structure including silicon nitride (SiNx) and silicon oxide (SiOx). The buffer layer BUF can improve an adhesive strength between a subsequently formed layer and the substrate SUB and block an alkali component from the substrate SUB.

A light shielding layer may be formed between the substrate SUB and the buffer layer BUF to block light incident from the outside. The light shielding layer may be formed of a metal material that can block light. In particular, the light shielding layer may be formed in an island shape corresponding to channel regions of the first and second TFTs T1 and T2.

First semiconductor layers A1, SA1, and DA1 and a first dummy semiconductor layer AD are formed on the buffer layer BUF. The first semiconductor layers A1, SA1, and DA1 are formed in a first area TA1, and the first dummy semiconductor layer AD is formed in a storage capacitor area STGA separated from the first semiconductor layers A1, SA1, and DA1. The first semiconductor layers A1, SA1, and DA1 include a channel region A1, a source region SA1, and a drain region DA1 of the first TFT T1. The channel region A1, the source region SA1, and the drain region DA1 are defined by the doping of ions.

A first semiconductor material is formed on the buffer layer BUF and is patterned to separately form the first semiconductor layers A1, SA1, and DA1 and the first dummy semiconductor layer AD. The first dummy semiconductor layer AD becomes a first electrode (or a lower electrode) of the first storage capacitor C1.

It is preferable, but not required, that the first TFT T1 includes a polycrystalline semiconductor material, for example, polycrystalline silicon. Further, it is preferable, but not required, that the first TFT T1 has a top-gate structure. The first semiconductor layers A1, SA1, and DA1 are polycrystalline silicon layers by depositing an amorphous silicon material and performing a dehydrogenation process and a crystallization process.

A first gate insulating layer GI1 is formed on the first semiconductor layers A1, SA1, and DA1, the first dummy semiconductor layer AD, and the buffer layer BUF. The first gate insulating layer GI1 is selected as a silicon nitride (SiNx) layer or a silicon oxide (SiOx) layer. The first gate insulating layer GI1 insulates the first semiconductor layers A1, SA1, and DA1 from the first dummy semiconductor layer AD.

A first gate electrode G1 and a first dummy gate electrode GC1 are formed on the first gate insulating layer GI1. The first gate electrode G1 is formed in the first area TA1, and the first dummy gate electrode GC1 is formed in the storage capacitor area STGA. A metal material is formed on the first gate insulating layer GI1 and is patterned to form the first gate electrode G1 and the first dummy gate electrode GC1. The first gate electrode G1 is disposed to overlap the channel region A1 among the first semiconductor layers A1, SA1, and DA1, and the first dummy gate electrode GC1 is separated from the first gate electrode G1.

The first dummy gate electrode GC1 becomes a second electrode (or an upper electrode) of the first storage capacitor C1 and also becomes a first electrode (or a lower electrode) of the second storage capacitor C2. The first dummy semiconductor layer AD and the first dummy gate electrode GC1 constitute the first storage capacitor C1.

First and second intermediate insulating layers ILD1 and ILD2 are deposited on the first gate insulating layer GI1 on which the first gate electrode G1 and the first dummy gate electrode GC1 are formed. The first and second intermediate insulating layers ILD1 and ILD2 are selected as a silicon nitride (SiNx) layer and a silicon oxide (SiOx) layer. The silicon nitride layer is deposited to diffuse hydrogen particles contained in the silicon nitride layer through a subsequent process and perform a hydrogenation process on the first semiconductor layers A1, SA1, and DA1 including polycrystalline silicon. The hydrogenation process is a process for filling vacancies, which are not bonded after an activation, with hydrogen atoms and is typically performed at a low temperature unlike the activation. Further, because the hydrogenation process is more affected by time than temperature, the hydrogenation process can obtain an enhanced result by increasing a process time of the hydrogenation process. The silicon oxide layer is deposited to reduce or prevent deformation (or degradation) of an oxide semiconductor element resulting from the hydrogen atoms contained in the silicon nitride layer.

First lower source and drain electrodes S1a and D1a, a second gate electrode G2, a second dummy gate electrode GC2, and a third dummy gate electrode GC3 are formed on the first and second intermediate insulating layers ILD1 and ILD2. The first lower source and drain electrodes S1a and D1a are formed in the first area TA1, the second gate electrode G2 is formed in the second area TA2, and the second dummy gate electrode GC2 and the third dummy gate electrode GC3 are formed in the storage capacitor area STGA.

A metal material is formed on the first and second intermediate insulating layers ILD1 and ILD2 and is patterned to form the first lower source and drain electrodes S1a and D1a, the second gate electrode G2, the second dummy gate electrode GC2, and the third dummy gate electrode GC3. The second gate electrode G2 is disposed to overlap a channel region of a second semiconductor layer A2 to be formed in a subsequent process. The second dummy gate electrode GC2 is separated from the second gate electrode G2.

The second dummy gate electrode GC2 becomes a second electrode (or an upper electrode) of the second storage capacitor C2 and also becomes a first electrode (or a lower electrode) of the third storage capacitor C3. The first dummy gate electrode GC1 and the second dummy gate electrode GC2 constitute the second storage capacitor C2.

The third dummy gate electrode GC3 is connected to the first dummy gate electrode GC1 through a contact hole. The third dummy gate electrode GC3 functions as a connection electrode for an electrical connection between the first dummy gate electrode GC1 and a first dummy source-drain electrode GS1 to be formed in a subsequent process.

A second gate insulating layer GI2 is formed on the second intermediate insulating layer ILD2, on which the first lower source and drain electrodes S1a and D1a, the second gate electrode G2, the second dummy gate electrode GC2, and the third dummy gate electrode GC3 are formed. The second gate insulating layer GI2 is selected as a silicon oxide (SiOx) layer. The second gate insulating layer GI2 insulates the first lower source and drain electrodes S1a and D1a, the second gate electrode G2, the second dummy gate electrode GC2, and the third dummy gate electrode GC3 from one another.

The second semiconductor layer A2 is formed on the second gate insulating layer GI2. The second semiconductor layer A2 is formed in the second area TA2. An oxide semiconductor material, for example, indium gallium zinc oxide (IGZO) is formed on the second gate insulating layer GI2 and is patterned to form the second semiconductor layer A2, and a thermal process is performed on the second semiconductor layer A2. The second semiconductor layer A2 is disposed to overlap the second gate electrode G2.

First upper source and drain electrodes S1*b* and D1*b*, second upper source and drain electrodes S2 and D2, and a first dummy source-drain electrode GS1 are formed on the second gate insulating layer GI2. A source material and a drain material are formed on the second gate insulating layer GI2 and are patterned to separately form the first upper source and drain electrodes S1*b* and D1*b* in the first area TA1, the second upper source and drain electrodes S2 and D2 in the second area TA2, and the first dummy source-drain electrode GS1 in the storage capacitor area STGA.

The first upper source electrode S1*b* is connected to the first lower source electrode S1*a* connected to the source region SA1 of the first semiconductor layers A1, SA1, and DA1 through a contact hole. The first upper drain electrode D1*b* is connected to the first lower drain electrode D1*a* connected to the drain region DA1 of the first semiconductor layers A1, SA1, and DA1 through a contact hole. The first upper source and drain electrodes S1*b* and D1*b* become source and drain electrodes of the first TFT T1.

The second upper source and drain electrodes S2 and D2 are separated from the first upper source and drain electrodes S1*b* and D1*b*. The second upper source electrode S2 is connected to a source region of the second semiconductor layer A2, and the second upper drain electrode D2 is connected to a drain region of the second semiconductor layer A2. The second upper source and drain electrodes S2 and D2 become source and drain electrodes of the second TFT T2. The second upper source and drain electrodes S2 and D2 are formed on the same stratum as the source and drain electrodes of the first TFT T1 using the same material as the source and drain electrodes of the first TFT T1.

The first dummy source-drain electrode GS1 is connected to the third dummy gate electrode GC3 through a contact hole. The first dummy source-drain electrode GS1 is disposed to overlap the second and third dummy gate electrodes GC2 and GC3. The first dummy source-drain electrode GS1 becomes a second electrode (or an upper electrode) of the third storage capacitor C3 and also becomes a first electrode (or a lower electrode) of the fourth storage capacitor C4. The second dummy gate electrode GC2 and the first dummy source-drain electrode GS1 constitute the third storage capacitor C3.

A passivation layer PAS is formed on the second gate insulating layer GI2, on which the first upper source and drain electrodes S1*b* and D1*b*, the second upper source and drain electrodes S2 and D2, and the first dummy source-drain electrode GS1 are formed.

A planarization layer PAC is formed on the passivation layer PAS. The planarization layer PAC may be formed of an organic material with a high thickness and a low permittivity, thereby uniformly planarizing the surface. Other methods may be used.

A pixel electrode PXL and a dummy pixel electrode GP are formed on the planarization layer PAC. A transparent electrode material, for example, indium tin oxide (ITO) is formed on the passivation layer PAS and is patterned to separately form the pixel electrode PXL in the first and second areas TA1 and TA2 and the dummy pixel electrode GP in the storage capacitor area STGA.

The pixel electrode PXL is connected to the first upper source electrode S1*b* through a contact hole. The pixel electrode PXL becomes a pixel electrode of a liquid crystal display, or becomes an anode electrode (or a cathode electrode) of an OLED display depending on a structure of a display panel which will be formed later.

The dummy pixel electrode GP is connected to the second dummy gate electrode GC2 through a contact hole. The dummy pixel electrode GP is disposed to overlap the second dummy gate electrode GC2 and the first dummy source-drain electrode GS1. The dummy pixel electrode GP becomes a second electrode (or an upper electrode) of the fourth storage capacitor C4. The first dummy source-drain electrode GS1 and the dummy pixel electrode GP constitute the fourth storage capacitor C4.

Referring to FIG. 6, a TFT substrate for a display device according to a modified example of the third embodiment of the present disclosure includes a first TFT T1 and a second TFT T2 that are disposed on a substrate SUB, and first to fourth storage capacitors C1 to C4. The first TFT T1 and the second TFT T2 may be separated from each other at a predetermined distance.

According to the modified example of the third embodiment of the present disclosure, a planarization layer PAC positioned in a storage capacitor area STGA is patterned and removed. Hence, a dummy pixel electrode GP is formed through the same process as a pixel electrode PXL and is positioned on a passivation layer PAS. When the dummy pixel electrode GP is positioned on the passivation layer PAS as described above, charge characteristics of the fourth storage capacitor C4 can be further improved, as $C = \in *A/d$, wherein C is a capacitance, E is permittivity, A is an area, and d is a distance.

According to the modified example of the third embodiment of the present disclosure, only a first intermediate insulating layer ILD1 is formed on a first gate insulating layer GI1. When only the first intermediate insulating layer ILD1 is formed on the first gate insulating layer GI1 as described above, the first intermediate insulating layer ILD1 is selected as a silicon nitride (SiNx) layer, and a second gate insulating layer GI2 formed on the first intermediate insulating layer ILD1 is selected as a silicon oxide (SiOx) layer.

According to the modified example of the third embodiment of the present disclosure, because the intermediate insulating layer is configured with a single layer, not multiple layers, a turn-on current Ion of the TFT can be reduced or prevented from decreasing due to an increase in a thickness of the intermediate insulating layer. Further, a size of the TFT can be decreased, while uniformly securing a turn-on current Ion.

Afterwards, the TFT substrate for a display device is implemented in a flat panel display, such as a liquid crystal display and an OLED display, depending on electrodes and structures formed after the pixel electrode.

As described above, the TFT substrate for a display device according to the third embodiment of the present disclosure has a structure, in which the first TFT T1 including a polycrystalline semiconductor material and the second TFT T2 including an oxide semiconductor material are formed on the same substrate SUB. In particular, the source and drain electrodes of the first TFT T1 and the source and drain electrodes of the second TFT T2 are formed on the same stratum using the same material. Further, the TFT substrate includes the plurality of storage capacitors C1 to C4 formed based on the semiconductor layer and the electrodes constituting the first and second TFTs T1 and T2.

The embodiments of the present disclosure have advantages of low power consumption (or low frequency) and low voltage characteristics (or oxide saturation characteristics) using an oxide TFT and at the same time, have an advantage of high mobility using a polycrystalline silicon TFT (or LTPS TFT). Further, the first embodiment of the present disclosure can reduce or prevent hydrogen atoms from the silicon nitride layer from being excessively diffused into the oxide semiconductor layer. Thus, the embodiments of the present disclosure can address a problem of deformation (or degradation) of an oxide semiconductor element resulting from hydrogen atoms of the silicon nitride layer when the TFT substrate for a display device including different types of TFTs is manufactured. Further, the embodiments of the present disclosure can increase an aperture ratio while maintaining or increasing an amount of capacitance of the storage capacitors that are connected in parallel to one another and have a multi-layered structure.

The TFT substrate and the display device using the same according to the embodiments of the present disclosure form two different types of TFTs on the same substrate, thereby addressing disadvantages of one type of TFT using the other type of TFT. In particular, the embodiments of the present disclosure can reduce power consumption through the TFT having a low speed driving characteristic and thus, can provide a display device suitable for portable and/or wearable devices. Further, the TFT substrate and the display device using the same according to the embodiments of the present disclosure can reduce or prevent hydrogen atoms from the silicon nitride layer from being diffused into the oxide semiconductor layer. The TFT substrate and the display device using the same according to the embodiments of the present disclosure can increase the aperture ratio while simplifying the manufacturing process and maintaining or increasing an amount of capacitance of the storage capacitors that are connected in parallel to one another and have a multi-layered structure. Further, the TFT substrate and the display device using the same according to the embodiments of the present disclosure can uniformly secure a turn-on current of the TFT.

Hereinafter, application examples of the TFT substrates according to the first to third embodiments of the present disclosure will be described.

Figure 7:
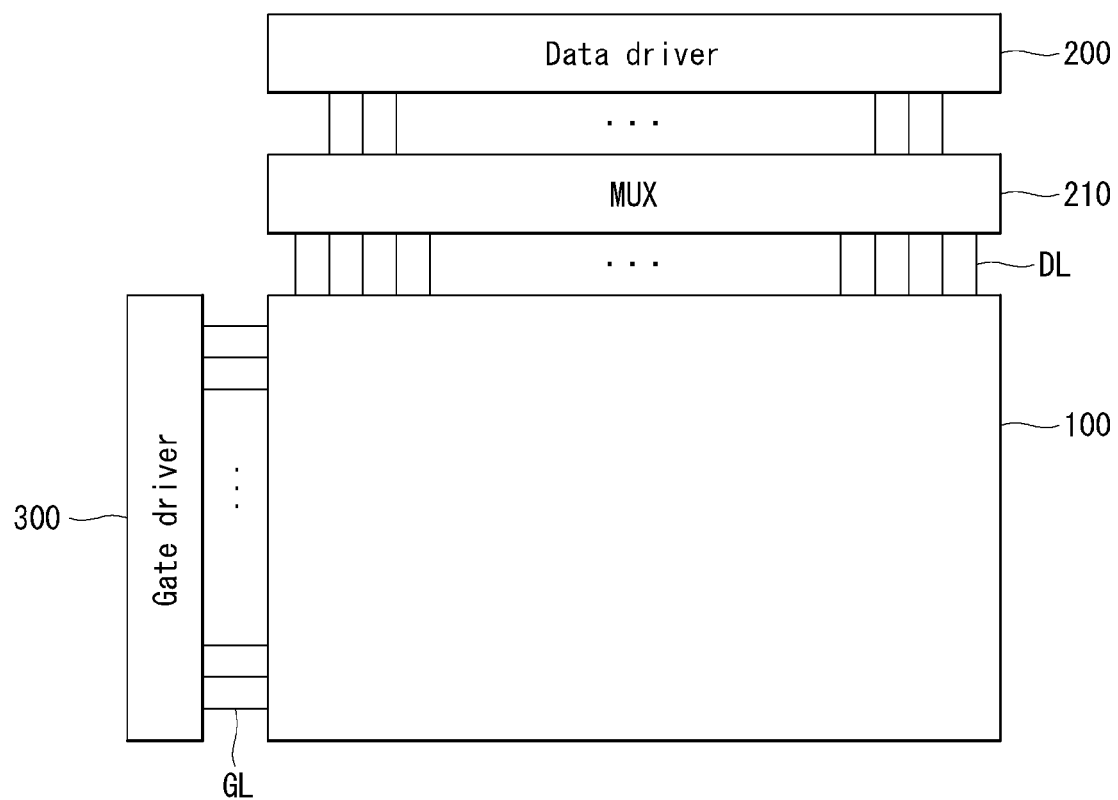
FIG. 7 is a block diagram schematically illustrating a configuration of a display device according to a first application example of the present disclosure.
Figure 8:
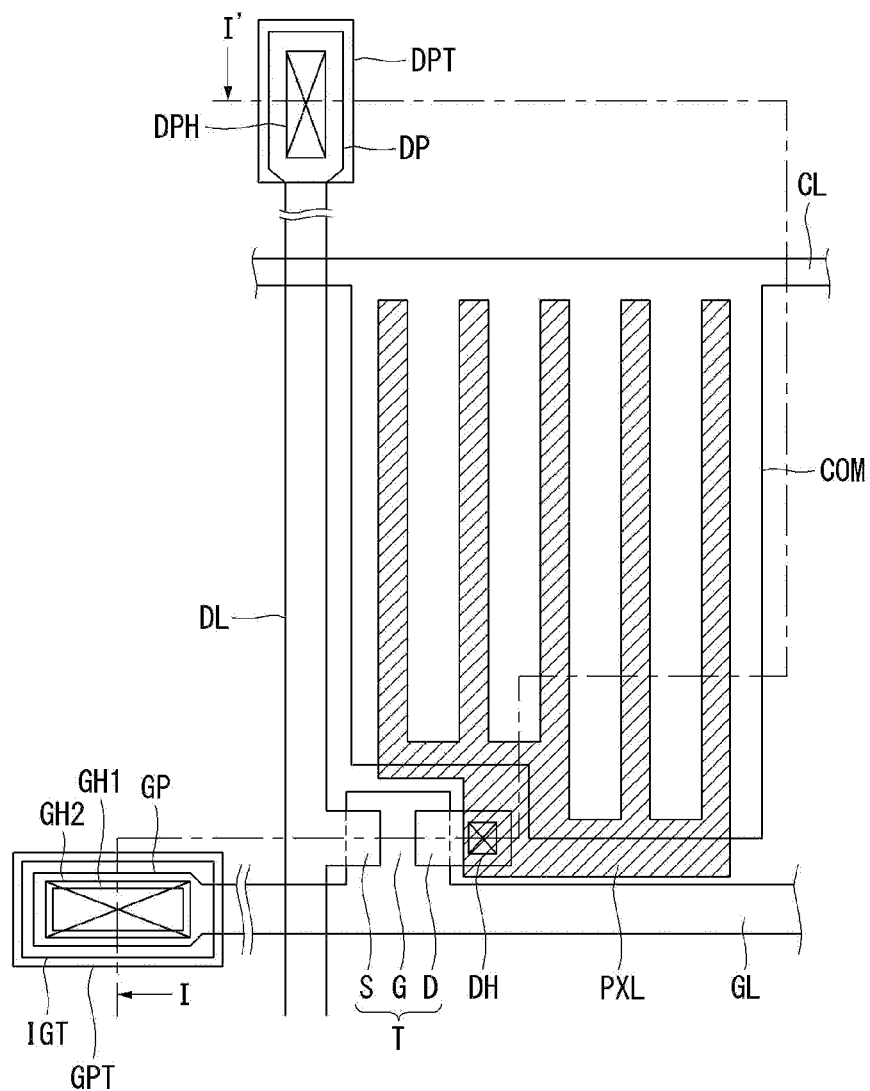
FIG. 8 is a plane view illustrating a thin film transistor substrate including an oxide semiconductor layer included in a fringe field type liquid crystal display according to a second application example of the present disclosure.
Figure 9:
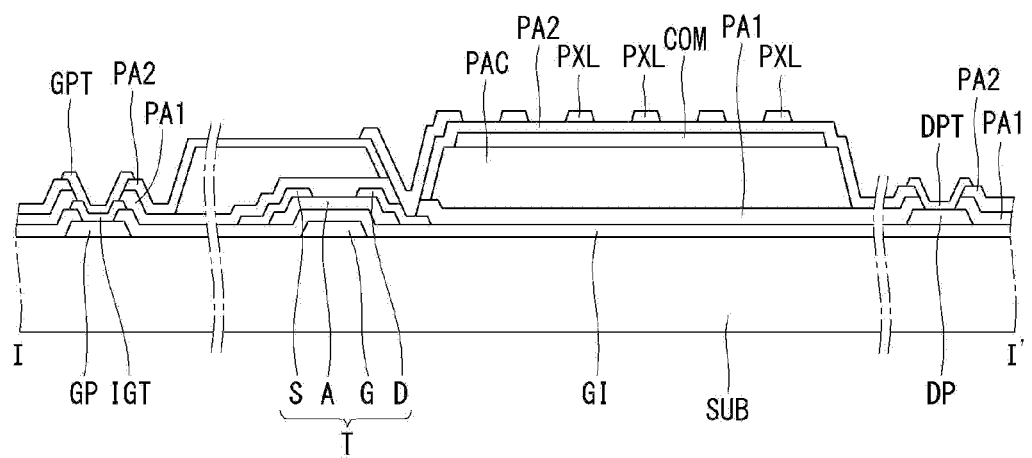
FIG. 9 is a cross-sectional view taken along line I-I' of FIG. 8.
Figure 10:
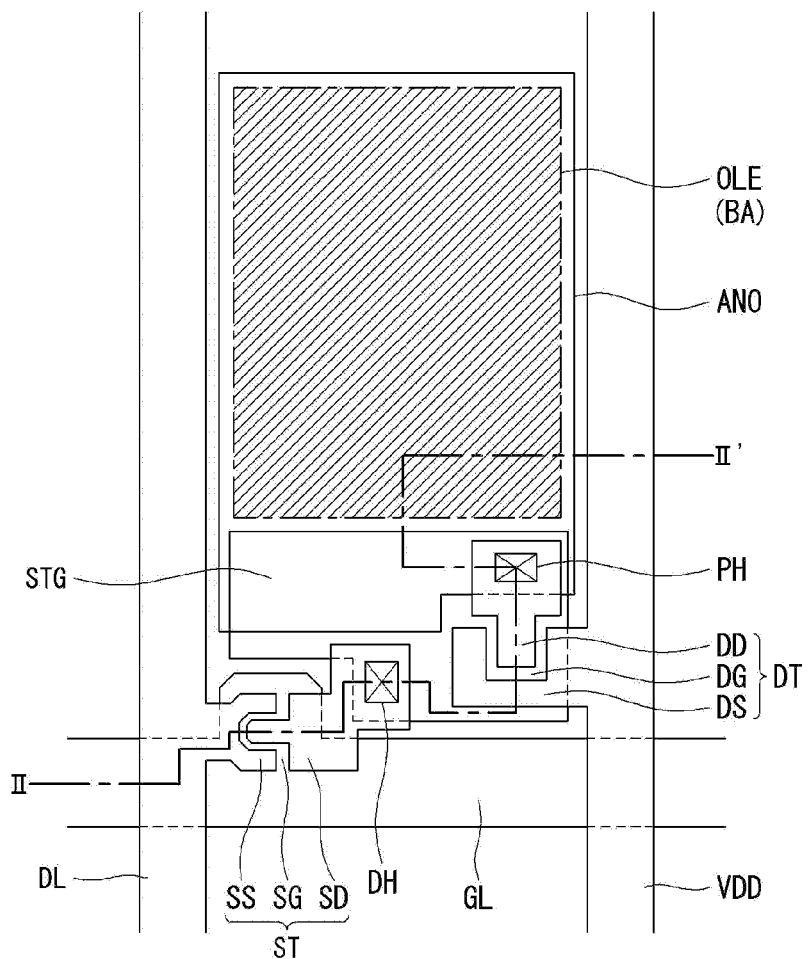
FIG. 10 is a plane view illustrating a structure of one pixel in an active matrix organic light emitting diode (OLED) display according to a third application example of the present disclosure.
Figure 11:
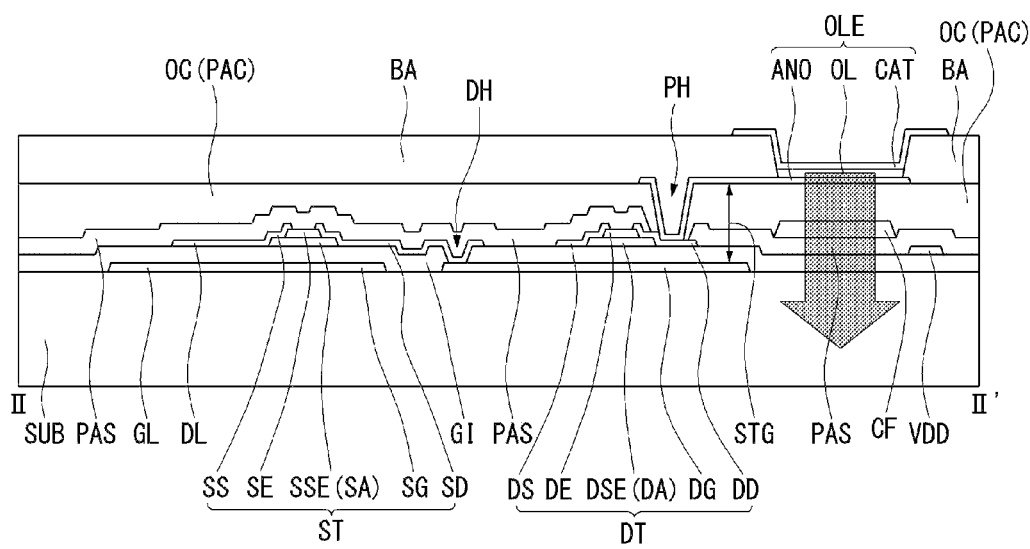
FIG. 11 is a cross-sectional view taken along line II-II' of FIG. 10.
Figure 12:
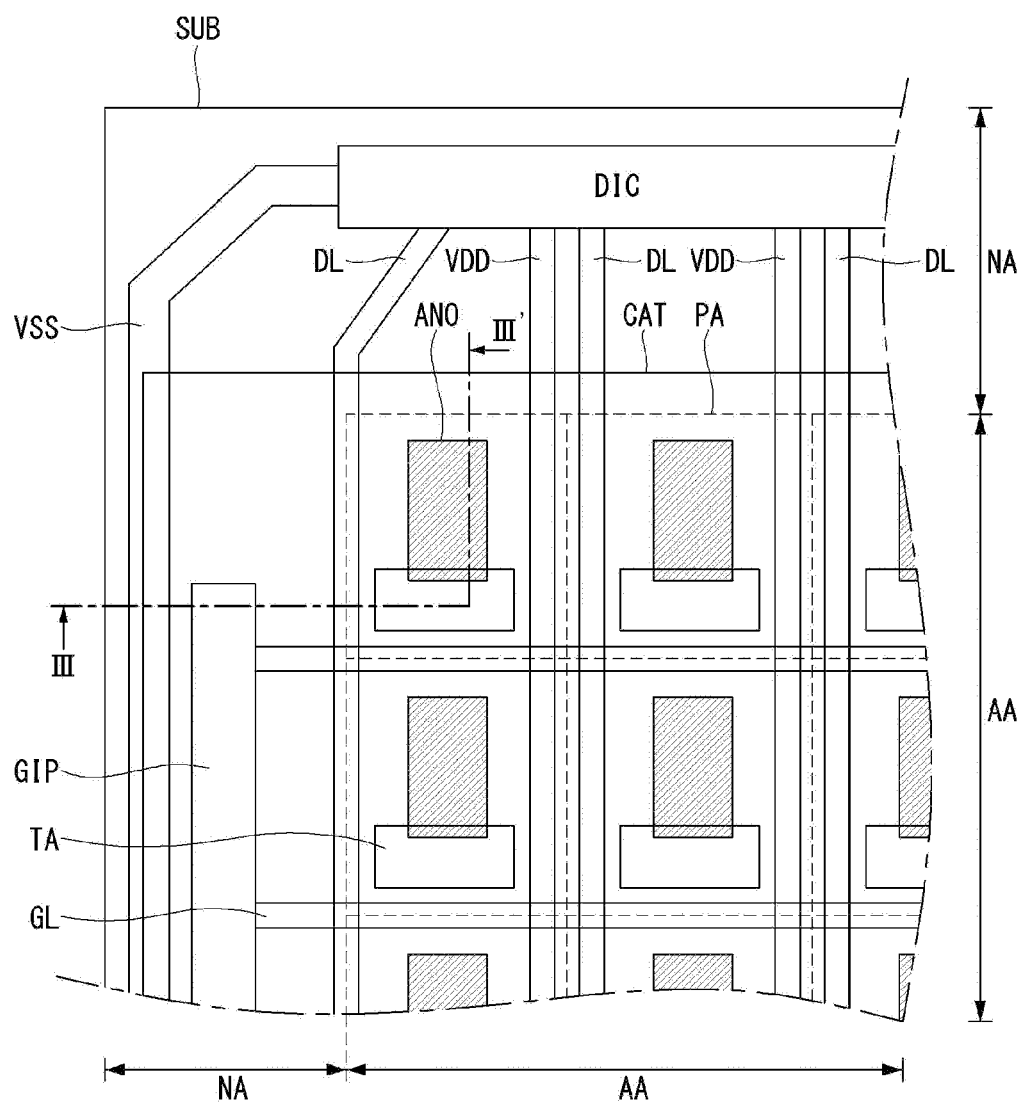
FIG. 12 is an enlarged plane view schematically illustrating a structure of an OLED display according to a fourth application example of the present disclosure.
Figure 13:
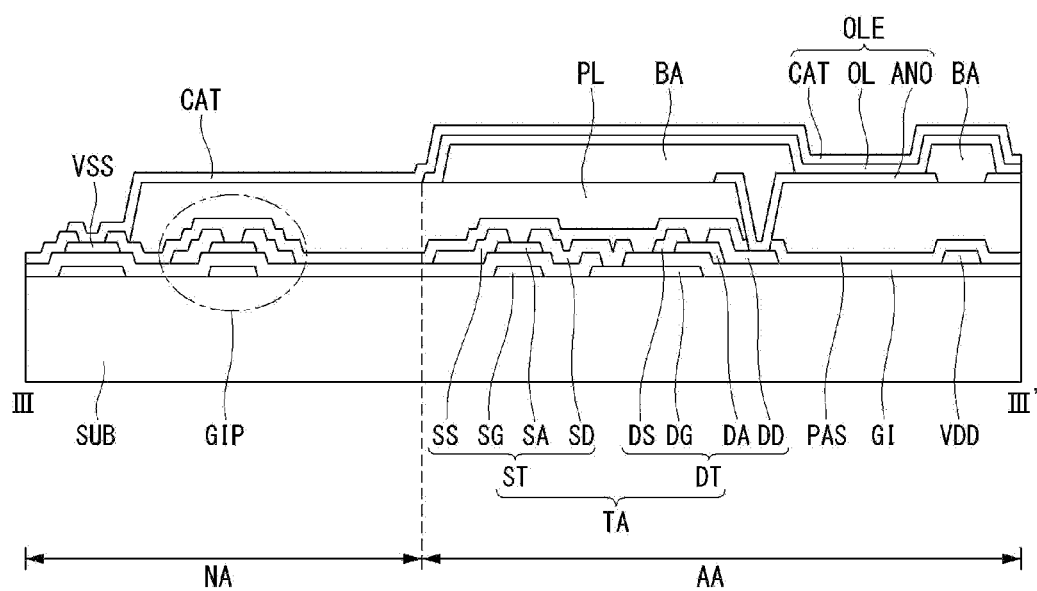
FIG. 13 is a cross-sectional view taken along line of FIG. 12.

FIG. 7 is a block diagram schematically illustrating a configuration of a display device according to a first application example of the present disclosure. FIG. 8 is a plane view illustrating a thin film transistor substrate including an oxide semiconductor layer included in a fringe field type liquid crystal display according to a second application example of the present disclosure. FIG. 9 is a cross-sectional view taken along line I-I' of FIG. 8. FIG. 10 is a plane view illustrating a structure of one pixel in an active matrix organic light emitting diode (OLED) display according to a third application example of the present disclosure. FIG. 11 is a cross-sectional view taken along line II-II' of FIG. 10. FIG. 12 is an enlarged plane view schematically illustrating a structure of an OLED display according to a fourth application example of the present disclosure. FIG. 13 is a cross-sectional view taken along line of FIG. 12.

First Application Example

As illustrated in FIG. 7, at least one of the above-described TFTs may be formed in each pixel of a display panel 100 and may switch a data voltage applied to each pixel or drive each pixel. In case of an organic light emitting diode display, a first TFT positioned in a non-display area of the display panel 100 may operate as a driving element of each pixel, and a second TFT positioned in a display area of the display panel 100 may operate as a switching element of each pixel. Other configurations may be used. For example, the first and second TFTs are not separately positioned in the non-display area and the display area and may be combined. Further, the first and second TFTs may be applied to one switching element or one driving element, for example, a CMOS TFT.

In small-sized display devices, for example, a mobile device or a wearable device, a lower speed driving method using a low frame rate can be adopted to reduce power consumption. In this instance, a frame frequency may be lowered for a still image and/or an image having a slower update interval. Each time the data voltage changes, a luminance of the display device may be flashed according to the lower frame rate. In some cases, as a discharge time interval of a pixel voltage increases, the display may flicker in each data update period. By applying the TFTs according to the embodiments of the present disclosure to each pixel of the display device, such a flicker problem at a lower speed driving method can be reduced or prevented.

In the lower speed driving method, as the data update period increases, an amount of of leaked current of a switching thin film transistor may increase. The leaked current of the switching thin film transistor may cause a voltage drop at a storage capacitance and between a gate electrode and a source electrode of a driving thin film transistor. A second TFT including an oxide semiconductor material may be applied to a switching thin film transistor of an organic light emitting diode display. Because a thin film transistor including an oxide semiconductor material has lower off-current characteristics, the voltage drop at the storage capacitance and/or the gate electrode of the driving thin film transistor can be reduced or prevented. The flicker problem can be reduced or prevented when using the lower speed driving method.

As polycrystalline silicon has a high mobility, by applying a first TFT including polycrystalline silicon to a driving thin film transistor of an organic light emitting diode display, an amount of current supplied to the organic light emitting diode may increase. Therefore, by applying the second TFT to a switching thin film transistor and the first TFT to a driving thin film transistor, the organic light emitting diode display can reduce or prevent a reduction in image quality while maintaining or reducing power consumption.

As a TFT substrate according to an embodiment of the present disclosure has a good image quality with reduced or minimized flickers even when a lower speed driving method is applied, it can be suitable for a mobile display or a wearable display. For an example of wearable wrist watch, video data may be updated at every one second for reducing power consumption. In this instance, the frame frequency is 1 Hz. Using an arrangement according to an embodiment of the present disclosure, a good image quality with less flickering can be achieved even when the video data is driven at a lower frequency, for example, at 1 Hz or less. Further, for a mobile display or a wearable display, the frame rate for an still image can be remarkably lowered so that the power consumption can be reduced with reduced or minimized degradation of image quality. As a result, the image quality of the mobile display and/or wearable display can be improved, and the life time of the battery can be elongated. In addition, an embodiment of the present disclosure can be applied to an electric book device (or 'E-Book') of which its data update period is relatively long, with reduced or minimized degradation of image quality.

At least one of the first and second TFTs may be embedded in a driver IC, for example, any one of a data driver IC 200, a multiplexer (or 'MUX') 210, and a gate driver IC 300, for forming the driver IC. In another case, one of the first and second TFTs is disposed within the pixel, and the other is disposed in the driver IC. The data driver 200 converts input video data into voltage values and outputs the voltage values. The multiplexer 210 may reduce the number of output channels of the data driver 200, by distributing the data voltages from the data driver 200 to data lines DL through a time-sharing method or a time-division method. The gate driver IC 300 outputs a scan signal (or a gate signal) to gate line GL synchronized with the data voltage for sequentially selecting a pixel line to which the data voltage is applied. In order to reduce the number of output channels of the gate driver IC 300, other multiplexers not shown in the figures may be further included between the gate driver IC 300 and the gate line GL. The multiplexer 210 and the gate driver IC 300 may be disposed within the non-display area NA, and the pixel array may be disposed within the display area AA.

Second Application Example

As illustrated in FIGS. 8 and 9, a TFT substrate having a metal oxide semiconductor layer includes a gate line GL and a data line DL crossing each other with a gate insulating layer GI therebetween on a lower substrate SUB, and a thin film transistor T formed at each crossing. By the crossing structure of the gate line GL and the data line DL, a pixel area is defined.

The thin film transistor T includes a gate electrode G branched (or 'extruded') from the gate line GL, a source electrode S branched from the data line DL, a drain electrode D facing the source electrode S, and a semiconductor layer A overlapping the gate electrode G on the gate insulating layer GI for forming a channel region between a source electrode S and a drain electrode D of the thin film transistor T.

At one end of the gate line GL, a gate pad GP is disposed for receiving the gate signal. The gate pad GP is connected to a gate pad intermediate terminal IGT through a first gate pad contact hole GH1 penetrating the gate insulating layer GI. The gate pad intermediate terminal IGT is connected to a gate pad terminal GPT through a second gate pad contact hole GH2 penetrating a first passivation layer PA1 and a second passivation layer PA2. Further, at one end of the data line DL, a data pad DP is disposed for receiving the pixel signal. The data pad DP is connected to a data pad terminal DPT through a data pad contact hole DPH penetrating the first passivation layer PA1 and the second passivation layer PA2.

In the pixel area, a pixel electrode PXL and a common electrode COM are formed with the second passivation layer PA2 interposed therebetween, to form a fringe electric field. The common electrode COM is connected to a common line CL disposed in parallel with the gate line GL. The common electrode COM is supplied with a reference voltage (or "common voltage") via the common line CL. For other cases, the common electrode COM has one sheet electrode shape which covers the entire surface of the substrate SUB except a formation portion of the drain contact hole DH. Namely, covering over the data line DL, the common electrode COM can operate as a shielding means for the data line DL.

The common electrode COM and the pixel electrode PXL can have various shapes and positions according to design purpose and environment. While the common electrode COM is supplied with a reference voltage having a constant value, the pixel electrode PXL is supplied with a data voltage varying timely according to the video data. Therefore, between the data line DL and the pixel electrode PXL, a parasitic capacitance may be formed. Due to the parasitic capacitance, the image quality of the display may be degraded. Therefore, it is preferable that the common electrode COM is disposed at a lower layer and the pixel electrode PXL is disposed at an uppermost layer.

In other words, on the first passivation layer PA1 covering the data line DL and the thin film transistor T, a planarization layer PAC is stacked thereon by depositing an organic material having a high thickness and a low permittivity. Then, the common electrode COM is formed. And then, after depositing the second passivation layer PA2 to cover the common electrode COM, the pixel electrode PXL overlapping the common electrode COM is formed on the second passivation layer PA2. In such a structure, the pixel electrode PXL is separated from the data line DL by the first passivation layer PA1, the planarization layer PAC, and the second passivation layer PA2, so as to reduce a parasitic capacitance between the data line DL and the pixel electrode PXL. Other configurations may be used. For example, the pixel electrode PXL may be disposed at a lower layer, and the common electrode COM may be disposed at an uppermost layer.

The common electrode COM may have a rectangular shape corresponding to the pixel area. The pixel electrode PXL may have a shape of a plurality of segments. In particular, the pixel electrode PXL vertically overlaps the common electrode COM with the second passivation layer PA2 interposed therebetween. Between the pixel electrode PXL and the common electrode COM, a fringe electric field is formed. With the fringe electric field, liquid crystal molecules arrayed between the thin film transistor substrate and a color filter substrate in a plane direction may rotate in accordance with the dielectric anisotropy of the liquid crystal molecules. According to a rotation degree of the liquid crystal molecules, a light transmittance of the pixel area may be changed so as to represent a desired gray scale.

In FIGS. 8 and 9 explaining the second application example of the present disclosure, the thin film transistor T of the liquid crystal display is schematically shown for the sake of brevity and ease of understanding. The first TFT and/or the second TFT described in the first to third embodiments of the present disclosure can be applied to the second application example. For example, for a low speed driving, a TFT including an oxide semiconductor material can be applied to the thin film transistor T. In another example, for low power consumption, a TFT including a polycrystalline semiconductor material may be applied to the thin film transistor T. In still another example, the thin film transistor T may be formed as including the first and second TFTs that are connected so that their performance and characteristics can compensate for each other.

Third Application Example

As illustrated in FIGS. 10 and 11, an active matrix type organic light emitting diode display includes a switching thin film transistor ST, a driving thin film transistor DT connected to the switching thin film transistor ST, and an organic light emitting diode OLE connected to the driving thin film transistor DT.

The switching thin film transistor ST is formed at a crossing of a gate line GL and a data line DL on a substrate SUB. The switching thin film transistor ST supplies a data voltage from the data line DL to a gate electrode DG of the driving thin film transistor DT and a storage capacitance STG in response to a scan signal, thereby functioning to select the pixel connected to the switching thin film transistor ST. The switching thin film transistor ST includes a gate electrode SG branching from the gate line GL, a semiconductor channel layer SA overlapping with the gate electrode SG, a source electrode SS, and a drain electrode SD. Controlling an amount of a current applied to the organic light emitting diode OLE of the pixel based on the gate voltage, the driving thin film transistor DT acts for driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to a driving current line VDD, and a drain electrode DD. The drain electrode DD of the driving thin film transistor DT is connected to an anode electrode ANO of the organic light emitting diode OLE. An organic light emitting layer OL is disposed between the anode electrode ANO and a cathode electrode CAT. The cathode electrode CAT is connected to a ground line Vss.

On the substrate SUB of the active matrix organic light emitting diode display, the gate electrodes SG and DG of the switching thin film transistor ST and the driving thin film transistor DT are disposed. On the gate electrodes SG and DG, a gate insulating layer GI is deposited. On the gate insulating layer GI overlapping with the gate electrodes SG and DG, the semiconductor layers SA and DA are disposed, respectively. On the semiconductor layer SA and DA, the source electrodes SS and DS and the drain electrodes SD and DD facing and separated from each other, respectively, are disposed. The drain electrode SD of the switching thin film transistor ST is connected to the gate electrode DG of the driving thin film transistor DT via the drain contact hole DH penetrating the gate insulating layer GI. The passivation layer PAS is deposited on the substrate SUB having the switching thin film transistor ST and the driving thin film transistor DT.

A color filer CF is disposed in an area where the anode electrode ANO is disposed. It is preferable for the color filter CF to have as wide an area as possible. For example, it is preferable to overlap with some portions of the data line DL, the driving current line VDD and/or the gate line GL. The upper surface of the substrate SUB having these thin film transistors ST and DT and the color filters CF is not in an even and/or smooth condition, but in an uneven and/or rugged condition having many steps. In order that the organic light emitting diode display has a good luminescent quality over an entire display area, the organic light emitting layer OL beneficially has an even or smooth surface. To make the upper surface be in a planar and even condition, a planarization layer PAC or an overcoat layer OC is deposited on an entire surface of the substrate SUB.

Then, on the overcoat layer OC, the anode electrode ANO of the organic light emitting diode OLED is disposed. Here, the anode electrode ANO is connected to the drain electrode DD of the driving thin film transistor DT through the pixel contact hole PH penetrating the overcoat layer OC and the passivation layer PAS.

On the substrate SUB having the anode electrode ANO, a bank (or bank pattern) BA is disposed over the area having the switching thin film transistor ST, the driving thin film transistor DT and the various lines DL, GL and VDD, for defining the pixel area. The exposed portion of the anode electrode ANO by the bank BA is a light emitting area. On the anode electrode ANO exposed from the bank BA, the organic light emitting layer OL is deposited. On the organic light emitting layer OL, the cathode electrode ACT is deposited. For the case that the organic light emitting layer OL has a material emitting a white light, each pixel can represent various colors by the color filter CF disposed under the anode electrode ANO. The organic light emitting diode display illustrated in FIG. 11 is a bottom emission type display in which a visible light is radiated in a bottom direction of the display substrate.

Between the gate electrode DG of the driving thin film transistor DT and the anode electrode ANO, a storage capacitance STG may be formed. By being connected to the driving thin film transistor DT, the storage capacitance STG maintains the voltage supplied to the gate electrode DG of the driving thin film transistor DT from the switching thin film transistor ST in a stable condition.

Using the TFT substrate as described above, an active type flat panel display having enhanced properties can be obtained. Especially, to ensure excellent driving properties, it is preferable that the active layer of the thin film transistor includes a metal oxide semiconductor material.

Such a metal oxide semiconductor material may be degraded when it is exposed to light for a long time. Therefore, it is preferable that the thin film transistor including a metal oxide semiconductor material has a structure for blocking light from outside of the upper portion and/or the lower portion of the thin film transistor. For example, for the above-mentioned thin film transistor substrates, it is preferable that the thin film transistor has a bottom gate structure. That is, the light from the outside of the substrate, especially from a lower side of the substrate facing the observer, can be blocked by the gate electrode G including an opaque metal material.

A thin film transistor substrate for a flat panel display has a plurality of pixel areas disposed in a matrix. Further, each pixel area includes at least one thin film transistor. That is, over an entire substrate, a plurality of thin film transistors are disposed. The plurality of pixel areas and the plurality of thin film transistors used for the same purpose are to have the same quality, the same characteristics, and the same structure.

However, in some cases, thin film transistors are formed to have different characteristics from each other. For example, an organic light emitting diode display has at least one switching thin film transistor ST and at least one driving thin film transistor DT in one pixel area. As the purposes of the switching thin film transistor ST and the driving thin film transistor DT are different from each other, the characteristics of the two thin film transistors are different from each other as well. To do so, the switch thin film transistor ST and the driving thin film transistor DT may have the same structure and the same semiconductor material, but the channel layers of the two thin film transistors have different sizes for optimizing their characteristics by way of example. Alternatively, a compensating thin film transistor may further be included for supporting any specific functions or properties of any thin film transistor.

In FIGS. 10 and 11, a switching thin film transistor ST and a driving thin film transistor DT of an organic light emitting diode display of the third application example are shown. The thin film transistors explained from the first to third embodiments of the present disclosure can be applied to these thin film transistors. For example, a thin film transistor including an oxide semiconductor material can be applied to the switching thin film transistor ST. A thin film transistor including a polycrystalline semiconductor material may be applied to the driving thin film transistor DT. Therefore, by including the thin film transistors on one substrate, their performance and characteristics can compensate for each other.

Fourth Application Example

FIGS. 12 and 13 illustrate an organic light emitting diode display according to a fourth application example. The organic light emitting diode display according to the fourth application example includes a substrate SUB including a display area AA for representing the video information and a non-display area NA having various elements for driving the elements in the display area AA. In the display area AA, a plurality of pixel areas PA disposed in a matrix are defined.

For example, the pixel areas PA can be defined as an N (row)×M (column) matrix. However, the disposed pattern is not restricted to this manner, but may have various types. The pixel areas PA have the same size or different sizes. With one unit pixel having three subpixels including red (R), green (G) and blue (B) subpixels, the unit pixels are regularly disposed. The pixel area PA can be defined by a crossing structure between a plurality of gate lines GL running in a horizontal direction and a plurality of data lines DL running in a vertical direction.

In the non-display area NA defined as a peripheral area surrounding the pixel area PA, a data driving integrated circuit DIC for supplying video data to the data lines DL and a gate driving integrated circuit GIP for supplying a scan signal to the gate lines GL are disposed. For a higher resolution display panel (e.g., higher than VGA resolution) in which more data lines DL and more driving current lines VDD are used, the data driving integrated circuit DIC may be installed outside the substrate SUB, and data contact pads may be disposed on the substrate SUB instead of the data driving integrated circuit DIC.

For brevity, the gate driving integrated circuit GIP is formed on one side portion of the substrate SUB directly. A ground line Vss for supplying the ground voltage may be disposed on an outermost side of the substrate SUB. The ground line Vss is disposed so as to receive a ground voltage from an external device located outside the substrate SUB, and to supply the ground voltage to the data driving integrated circuit DIC and the gate driving integrated circuit GIP. For example, the ground line Vss may be linked to the data driving integrated circuit DIC disposed at an upper side of the substrate SUB and to the gate driving integrated circuit GIP disposed at a right side and/or left side of the substrate SUB so as to surround the substrate SUB.

At each pixel area PA, main elements such as an organic light emitting diode and thin film transistors for driving the organic light emitting diode are disposed. The thin film transistor is disposed in a thin film transistor area TA defined at one side of the pixel area PA. The organic light emitting diode includes an anode electrode ANO, a cathode electrode CAT and an organic light emission layer OL inserted between these two electrodes. An actual emission area is decided by the area of the organic light emission layer OL overlapping the anode electrode ANO.

The anode electrode ANO has a shape as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL so as to cover a whole surface of the display area AA having the pixel areas PA.

The cathode electrode CAT may go over the gate driving integrated circuit GIP and contact the ground line Vss disposed at the outer side. So, the ground voltage can be supplied to the cathode electrode CAT through the ground line Vss. The cathode electrode CAT receives the ground voltage and the anode electrode ANO receives a voltage corresponding to the video data and then, the organic light emission layer OL emits an amount of light based on a voltage difference between the cathode electrode CAT and the anode electrode ANO to represent video information.

On the substrate SUB, a non-display area NA and a display area AA are defined. The non-display area NA includes an area where the gate driving integrated circuit GIP and the ground line Vss are disposed. The display area AA includes an area where a switching thin film transistor ST, a driving thin film transistor DT and an organic light emitting diode OLE are defined.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planarization layer PL are sequentially deposited. On the planarization layer PL, an anode electrode ANO having an isolated rectangular shape within the pixel area PA is disposed. The anode electrode ANO contacts the drain electrode DD of the driving thin film transistor DT through the contact hole penetrating the passivation layer PAS and the planarization layer PL.

On the substrate SUB having the anode electrode ANO, a bank BA is deposited for defining the emission area. By patterning the bank BA, most center portions of the anode electrode ANO are exposed. On the exposed anode electrode ANO, an organic light emission layer OL is deposited. Depositing a transparent conductive material on the bank BA and the organic light emission layer OL, the cathode electrode CAT is stacked. The organic light emitting diode OLED including the anode electrode ANO, the organic light emission layer OL and the cathode electrode CAT is disposed.

In a case where the organic light emission layer OL may generate a white light, color filters CF may be further included to represent full color video information. In that case, the organic light emission layer OL is preferably deposited to cover a whole surface of the display area AA.

The cathode electrode CAT is expanded over the gate driving integrated circuit GIP so that it may cover the display area AA and the non-display area NA and contact the ground line Vss disposed at an outer circumstance of the substrate SUB. As a result, the ground (or, reference) voltage can be supplied to the cathode electrode CAT via the ground line Vss.

In addition, the ground line Vss may be formed on the same stratum using the same material as the gate electrodes SG and DG. In this instance, the cathode electrode CAT can be connected to the ground line Vss through a contact hole penetrating the passivation layer PAS and the gate insulating layer GI over the ground line Vss. Alternatively, the ground line Vss may be formed on the same stratum using the same material as the source and drain electrodes SS-SD and DS-DD. In this instance, the cathode electrode CAT can be connected to the ground line Vss through a contact hole penetrating the passivation layer PAS over the ground line Vss.

In FIGS. 12 and 13, the switching thin film transistor ST and the driving thin film transistor DT of the organic light emitting diode display of the fourth application example are illustrated. The first and/or the second TFTs, explained in the first to third embodiments of the present disclosure, can be applied to these thin film transistors. For example, the thin film transistor including an oxide semiconductor material can be applied for the switching thin film transistor ST. The thin film transistor including a polycrystalline semiconductor material may be applied for the driving thin film transistor DT. Further, for the gate driver IC GIP, the thin film transistor including a polycrystalline semiconductor material may be applied. For example, for the gate driver IC GIP, a C-MOS type thin film transistor may include P-MOS type and N-MOS type thin film transistors.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film transistor substrate comprising:
   a first thin film transistor on a substrate and including a polycrystalline semiconductor layer, a first gate electrode, a first source electrode and a first drain electrode;
   a second thin film transistor separated from the first thin film transistor and including a second gate electrode, an oxide semiconductor layer, a second source electrode, and a second drain electrode that are disposed on a layer covering the first gate electrode; and
   a plurality of storage capacitors separated from the first and second thin film transistors, the plurality of storage capacitors each including a first dummy semiconductor layer, a first gate insulating layer on the first dummy semiconductor layer, a first dummy gate electrode on the first gate insulating layer, an intermediate insulating layer on the first dummy gate electrode, a second dummy gate electrode on the intermediate insulating layer, a second gate insulating layer on the second dummy gate electrode, a first dummy source-drain electrode on the second gate insulating layer, a passivation layer on the first dummy source-drain electrode, and a dummy pixel electrode on the passivation layer.

2. The thin film transistor substrate of claim 1, wherein the dummy pixel electrode is positioned on a planarization layer covering the passivation layer.

3. The thin film transistor substrate of claim 1, wherein the intermediate insulating layer includes a first intermediate insulating layer formed of silicon nitride and a second intermediate insulating layer formed on the first intermediate insulating layer using silicon oxide.

4. The thin film transistor substrate of claim 1, wherein the first dummy source-drain electrode is connected to the first dummy gate electrode through a contact hole,
   wherein the second dummy gate electrode is connected to a second dummy source-drain electrode separated from the first dummy source-drain electrode through a contact hole,
   wherein the second dummy source-drain electrode is connected to the first dummy semiconductor layer through a contact hole, and
   wherein the dummy pixel electrode is connected to the second dummy source-drain electrode through a contact hole.

5. The thin film transistor substrate of claim 1, wherein the first dummy source-drain electrode is connected to the first dummy semiconductor layer through a contact hole,
   wherein a second dummy source-drain electrode positioned on the same stratum as the first dummy source-drain electrode is connected to the first dummy gate electrode through a contact hole, and
   wherein the dummy pixel electrode is connected to the second dummy source-drain electrode through a contact hole.

6. The thin film transistor substrate of claim 1, wherein the first source electrode includes a first lower source electrode positioned on the intermediate insulating layer and a first upper source electrode positioned on the second gate insulating layer covering the first lower source electrode, and
   wherein the first drain electrode includes a first lower drain electrode positioned on the intermediate insulating layer and a first upper drain electrode positioned on the second gate insulating layer covering the first lower drain electrode.

7. The thin film transistor substrate of claim 1, wherein the polycrystalline semiconductor layer, the first gate electrode, and the first source and drain electrodes are sequentially stacked on the substrate.

8. The thin film transistor substrate of claim 1, wherein the layer covering the first gate electrode is the polycrystalline semiconductor layer of the first thin film transistor.

9. An organic light emitting diode display comprising a thin film transistor substrate according to claim 1.

10. A liquid crystal display comprising a thin film transistor substrate according to claim 1.

* * * * *